United States Patent [19]
Hartman

[11] Patent Number: 5,364,290
[45] Date of Patent: Nov. 15, 1994

[54] ELECTRIC UTILITY REVENUE METER POLYCARBONATE BASE

[75] Inventor: Marinus Hartman, Pickering, Canada

[73] Assignee: Schlumberger Canada Limited, Ontario, Canada

[21] Appl. No.: 33,945

[22] Filed: Mar. 18, 1993

[30] Foreign Application Priority Data

Mar. 20, 1992 [CA] Canada .......................... 20636181

[51] Int. Cl.⁵ .......................................... H02B 9/00
[52] U.S. Cl. ........................... 439/517; 361/659; 361/668; 439/595
[58] Field of Search ............... 439/517, 595, 603; 324/110, 156, 157; 220/3.8, 378; 361/659, 667, 668

[56] References Cited

U.S. PATENT DOCUMENTS

| | | | |
|---|---|---|---|
| 1,664,672 | 4/1928 | Emens | 361/668 |
| 2,790,951 | 4/1957 | Holtz | 324/156 |
| 3,355,630 | 11/1967 | Orr | 439/517 |
| 3,846,677 | 11/1974 | Keever et al. | 361/672 |
| 3,943,413 | 3/1976 | Keever | 324/110 |
| 4,068,288 | 1/1978 | Finnen | 324/156 |
| 4,162,116 | 7/1979 | Lehmann | 439/278 |
| 4,419,554 | 12/1983 | Osika | 439/603 |
| 4,645,286 | 2/1987 | Isban et al. | 439/571 |
| 4,762,507 | 8/1988 | Rudy, Jr. et al. | 439/595 |
| 4,857,007 | 8/1989 | Michaels et al. | 439/283 |

*Primary Examiner*—Neil Abrams
*Attorney, Agent, or Firm*—Sanford J. Asman

[57] ABSTRACT

A base for an electric utility watt-hour meter made from a polycarbonate material preferably reinforced with glass fiber and ultraviolet light stabilized. The molded base receives current terminals that have outwardly directed lugs engaging one face of the base and there are locking arms on the other side of the base resiliently biased against the lug to engage a locking formation thereon. The base has a knife-edge rib extending about its periphery to sealingly engage a front edge face of a cup shaped transparent cover for the meter. A metal ring joins the cover to the base the metal ring being a band with a first series of lugs struck out and directed inwardly to engage the flange on the cover and a second group of tabs struck outwardly and bent inwardly to engage the bayonet ramp surfaces on the base.

5 Claims, 4 Drawing Sheets

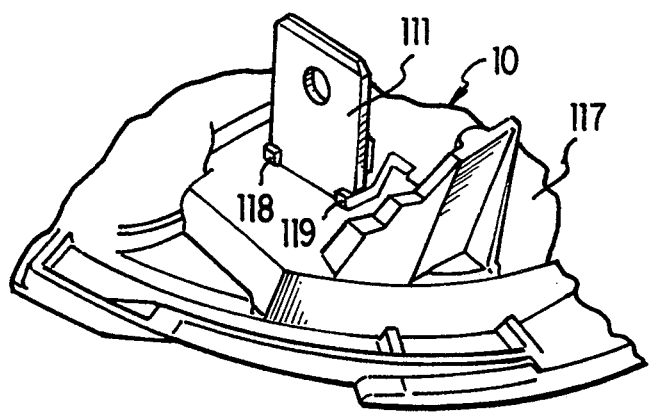
FIG. 7
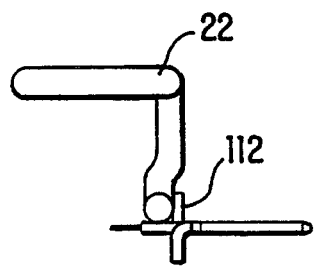
FIG. 5
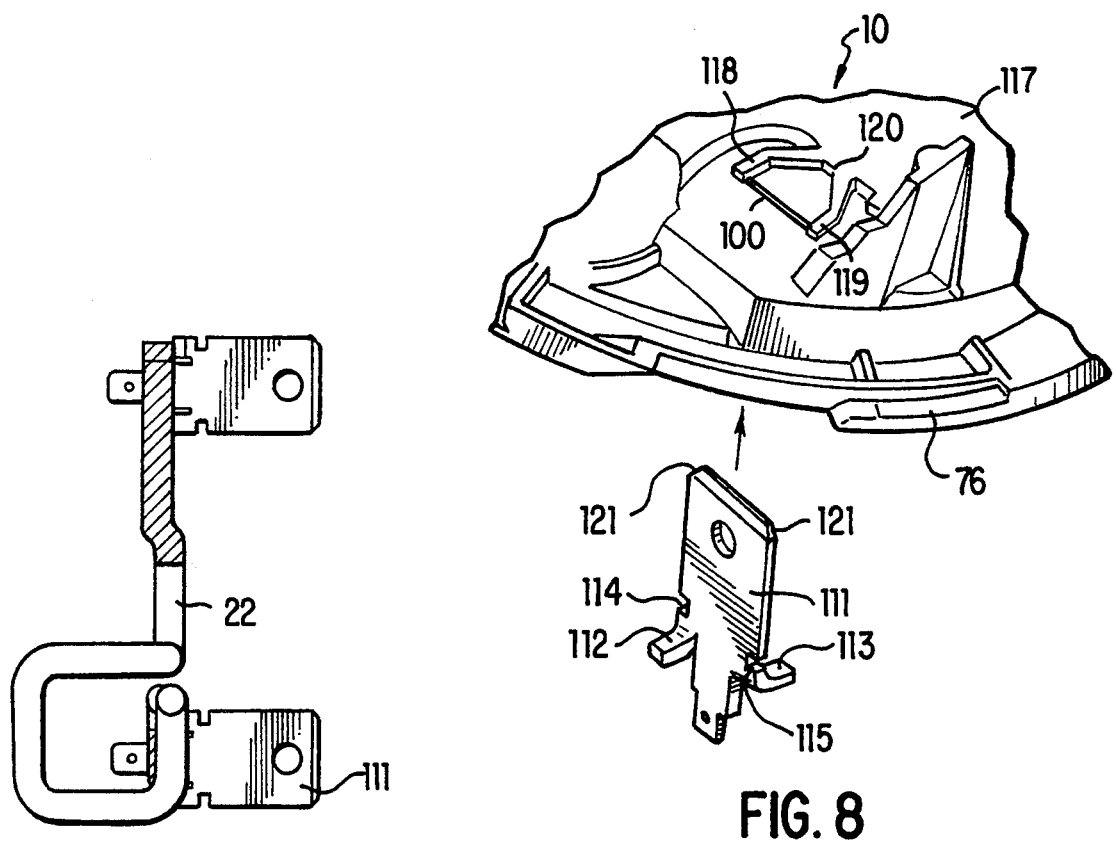
FIG. 8
FIG. 6

ELECTRIC UTILITY REVENUE METER POLYCARBONATE BASE

FIELD OF THE INVENTION

This invention relates generally to electric utility revenue meters and more particularly to a base therefor made of polycarbonate material and a meter incorporating such base. The invention also relates to an improved glass cover contact seal formed integral with the base and to an improved means of securing the cover to the base and means attaching the current terminals.

BACKGROUND OF THE INVENTION

Watt-hour meters, most commonly used as electric energy billing meters, are simple induction electro-mechanical meters. These meters have proven to have a high degree of accuracy and reliability through many years of service under varying-ambient operating conditions. The reliability of these meters is exemplified by the fact that accrediting authorities in countries such as Canada require only sample testing of meters after which the meters can be sealed for a period of twelve years. This seal can be indefinitely extended for periods of up to eight years, depending upon the accuracy criteria of the testing. A conventional electro-mechanical induction meter typically lasts about thirty to forty-five years. The basic parts of the meter are assembled on a frame mounted on a base. A glass cover attaches to the base to form an enclosure for the meter components. The cover is sealed to the base and they are designed so that it is almost impossible to tamper with or make adjustments to the meter without leaving evidence.

The existing meter bases are made from a phenolic material, i.e. bakelite, and the current terminals slide through slots in the base. The terminals are held in place by a rubber gasket and metal washer on the inside and a cotter pin through the blade terminal on the outside. Assembly of this structure is labor intensive and requires a number of parts.

The current terminals project through the base mating with the terminal receptacle or meter box normally mounted on the side of a house or building and provides the electrical connection from the utility distribution network through the meter to the house or building. The current is carried through a current coil in a conventional manner and a potential coil inducing flux in the electro-magnetic system to rotate the rotor in response to and proportional to the energy being consumed.

In the known prior art meters a seal is formed between the glass and the base by an O-ring fitting into a channel in the base adjacent its outer perimeter. This gasket presses against the glass cover forming a seal. As it is necessary to have the gasket loose on the base to form a proper seal it is sometimes awkward and difficult to handle the meter when the glass cover is removed without having the gasket fall out of its channel.

SUMMARY OF THE INVENTION

This invention provides a meter base that will withstand the use and environmental conditions to which a conventional meter is subjected while at the same time having sufficient resiliency to permit forming a seal integrally with the base for engagement with the glass cover.

The invention also simplifies the manner in which the current terminals attach to the base utilizing the resiliency provided by the polycarbonate material.

It is also an object of this invention to provide an improved ring joining the glass cover to the base.

In keeping with the foregoing there is provided, in accordance with one aspect of this invention, an induction meter base molded from a polycarbonate material. The base preferably has a knife-edge rib near its outer periphery for sealingly engaging a flange around the cup shaped glass cover.

In accordance with another aspect of this invention, a meter base made of a polycarbonate material is provided, having slots for current terminals for the inductive coils and lock means molded integral with the base and engageable with a formation on the terminals to lock the terminals in place.

There is also provided, in accordance with this invention, a metal rim for joining the glass cover to the base including a band in the form of an O-ring having a flange directed inwardly to engage and outwardly directed flange around the cup shaped cover, a first plurality of tabs struck out from said band and bent inwardly to engage an opposite outside face of said flange and a second plurality of tabs struck out from said band to engage tapered ramps adjacent an outer periphery of the base.

BRIEF DESCRIPTION OF THE DRAWINGS

The invention is illustrated by way of example in the accompanying drawings wherein:

FIG. 5 is an elevational view of one current coil with a pair of current terminals attached thereto;

FIG. 6 is an end elevational view of FIG. 5;

FIG. 7 is a portion of the meter base with a current terminal anchored thereto;

FIG. 8 is an oblique view of a portion of the meter base illustrating the current terminal prior to being inserted through a hole therefor provided in the base;

DESCRIPTION OF PREFERRED EMBODIMENTS

Figure 1:
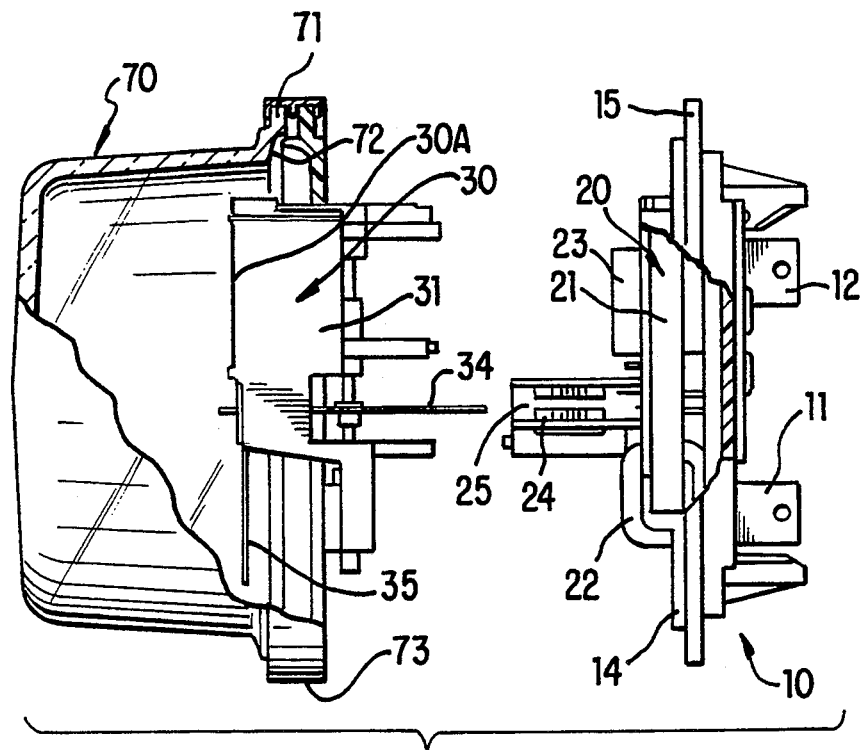
FIG. 1 is an exploded side elevational, view of an electro-mechanical induction watt-hour meter in accordance with this invention.

FIG. 1 is an exploded view of an induction watt-hour meter of this invention, the major components of which are a base 10, an electro-magnetic unit 20 with a disc brake magnet mounted thereon, a register and rotor unit 30, and a glass cover 70.

The electro-magnetic unit 20 has a core unit 21 with respective current and potential coils 22 and 23 mounted thereon. There are two current coils one of which is illustrated in FIGS. 5 and 6. A magnetic brake 24 is carried by electro-magnetic unit 20 and has a gap 25 for receiving a portion of a rotor disc 34. The electro-magnetic unit 20 securely attaches to molded base 10 and has pairs of current terminals 11 and 12 projecting therefrom. There are two current terminals (11 and 12) for each current coil and there are two current coils.

Figure 3:
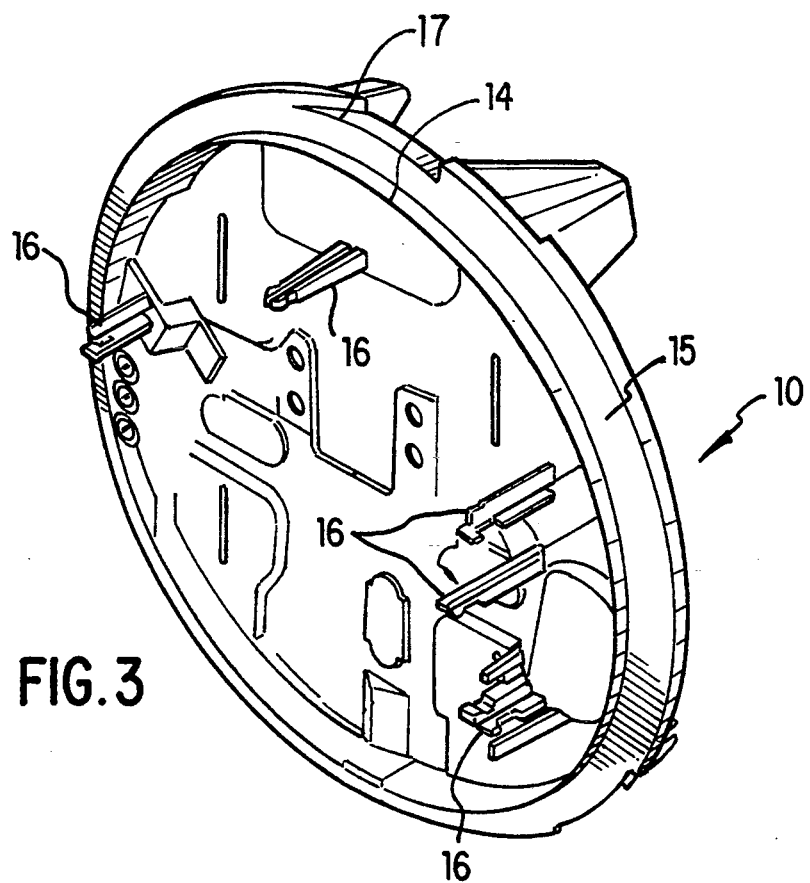
FIG. 3 is an oblique view of the base portion of the meter without the coil unit mounted therein illustrating spacer and mounting lugs for attaching the electro-magnetic and register units thereto.

Base 10 is molded from a rigid thermoplastic material, preferably a polycarbonate material such as polycarbonate resin #9417 available from Bayer Company of Germany under the trademark Makrolon, the resiliency of which is relied upon as will become more apparent hereinafter. Magnetic coil unit 20 snap fits onto the base by selected one of a plurality of lugs 16 (See FIG. 3) projecting from base 10. There are spacer and positioning lugs on base 10 and some of the lugs on the base cooperate with lugs projecting from the housing of the register unit.

The register and rotor unit 30 is a module that snap fits onto coil unit 20. Register and rotor unit 30 includes a molded plastic (preferably Ryton ® PPS) housing 31 having a plurality of spacer lugs 32 projecting therefrom and attaching lugs 33 for precisely locating register and rotor unit 30 relative to coil unit 20 and attaching register and rotor unit 30 to coil unit 20 mounted on the base.

The register and rotor unit 30 has a register diagrammatically illustrated on its face 30A and a name plate 35 that attaches to and extends downwardly from the molded plastic housing 31. Locating lugs 32 position register and rotor unit 30 relative to coil unit 20 such that a rotatable disc 34 on register and rotor unit 30 fits into gap 25 and lugs 33 snap fasten onto, as previously mentioned, coil unit 20 (and/or base unit 10).

Figure 2:
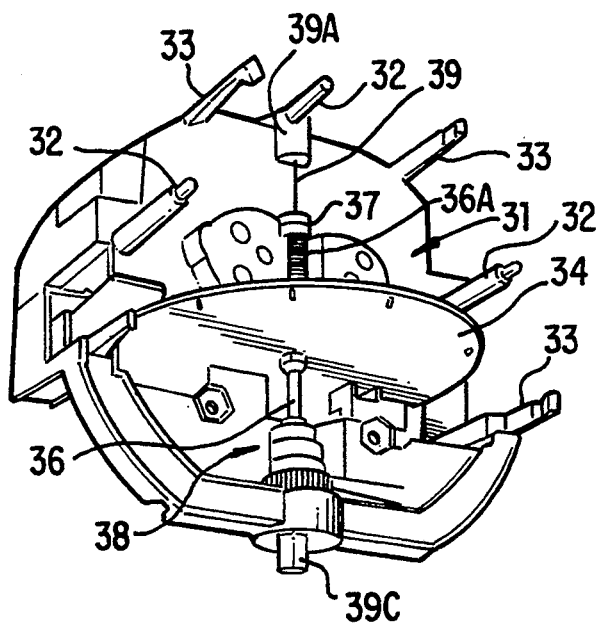
FIG. 2 is an oblique view of the register and rotary unit of the meter illustrated in FIG. 1.

Referring to FIG. 2, disc 34, which is caused to rotate by electro-magnetic unit 20 in a known manner, is mounted on a shaft or spindle 36 having respective upper and lower bearing units 37 and 38 on molded plastic housing unit 31. A pintle 39 associated with upper bearing 37 projects therefrom into a pintle receiving unit 39A on the molded plastic housing 31. Rotor shaft 36 has a worm gear 36A on the upper end thereof that meshes with a drive gear (not shown) for the register unit, which via dials visually indicates cumulatively the energy consumed.

Referring to FIGS. 1, 3, 8, and 10, the glass cover 70 has an outwardly directed flange 71 with a seat portion 72 that abuts against a seal forming knife edge rib 14 on the base 10. The outwardly directed flange 71 carries a metal ring 73 provided with lugs that engage tapered ramps 76 on the flange 15 of the base forming a bayonet-type mount whereby the glass cover and base may be rotated relative to one another to detachably join them together with the outer edge of rib 14 on the base being pressed against the seat 72 on the glass cover forming a seal.

The base 10, being molded of a polycarbonate material, is rigid but at the same time displays certain flexibility allowing for constructions and designs not made possible by the conventional bakelite base. The polycarbonate is preferably glass fiber reinforced (roughly 10% glass fiber) and ultraviolet light stabilized. The flexibility of the polycarbonate base is relied upon for attaching the current terminals and this is illustrated in detail with reference to FIGS. 4 to 8 inclusive.

Figure 4:
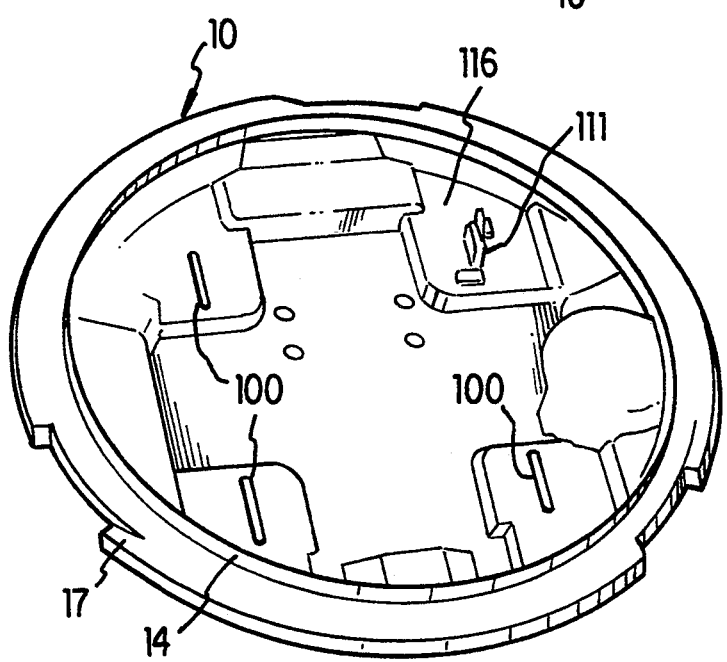
FIG. 4 is essentially the same as FIG. 3 but with the mounting lugs removed.

FIG. 4 illustrates the base 10 without the spacer lugs and connecting lugs. It is formed with four elongated slots 100 for receiving respective ones of four different current terminals 111, one of which is illustrated in FIG. 4 occupying one of the slots. The face of base 10, shown in FIG. 4, is the face disposed interiorly of the meter when the base is clampingly attached to the glass cover 70. FIGS. 7 and 8 show only a portion of base 10 but on the opposite face from that shown in FIG. 4, i.e., the face which is disposed exteriorly of the meter.

FIG. 8 shows which single current terminal 111 has two oppositely directed wings 112 and 113 spaced from respective notches 114 and 115 in opposite edges of the terminals. Wings 112 and 113 bear against the inside face 116 of base 10 and keep the current terminal from sliding through the slot. This eliminates the need for washers and gaskets as required in the prior art. Wings 112 and 113 also serve to position the current coil while it is being brazed to the terminal. One of the two current coils 22 illustrated in FIGS. 5 and 6, is a precision formed copper wire of large cross-sectional area. From FIG. 6 it will be noted that one of the wings, wing 112, bears against a portion of the coil. The two coils are the same except for one being left and the other right, i.e., a mirror image of one another.

FIG. 8 is an exploded view and includes a portion of base 10 illustrating its outer face 117 and a slot 100 for receiving the blade type current terminal 111. Formed integrally with the base is a pair of fingers 118 and 119, which, adjacent their free ends, overlap respective opposite end portions of slot 100. Fingers 118 and 119 merge into the rest of the base as indicated at 120 and forwardly thereof the fingers are free to move relative to the base. The leading end of the terminal is chamfered as at 121 and when terminal 111 blade is inserted into the slot the blade causes the arms 118 and 119 to flex outwardly. As blade terminal 111 is pushed through to a position where wings 112 and 113 engage the interface of the base, fingers 118 and 119 snap into respective slots 114 and 115. This securely anchors the current terminal to the base, simplifying the assembly considerably compared with the conventionally used prior techniques. FIG. 7 illustrates terminal blade 111 in its final position with the fingers 118 and 119 seated in the respective slots 114 and 115.

The resiliency of the polycarbonate material, from which base 10 is made, also, as previously indicated, allows forming a seal integrally with the base eliminating the need of a separate O-ring as has been the common practice in the prior art.

Figure 10:
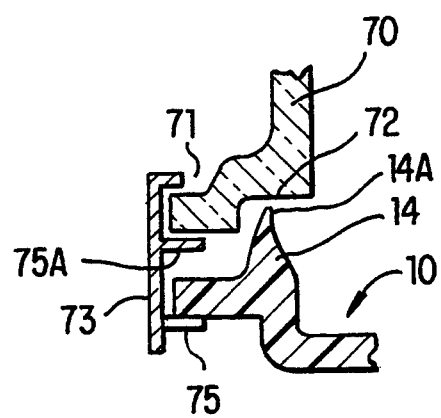
FIG. 10 is a partial sectional view illustrating sealing engagement of the glass cover with a knife edge rib formed integral with the molded polycarbonate base.

FIG. 10 is a partial cross-sectional view through an edge portion of the glass cover and metal ring and the base clearly illustrating peripheral rib 14 as having a knife edge 14A that engages the seat 72 of the glass cover.

Base 10 is attached to glass cover 70 by a metal ring 73 in the form of a band that has lugs 75 projecting therefrom and which engage ramps 76 on the base. This forms a bayonet mount with the inclined ramp 76 bringing the base and glass cover into tight pressure engagement as one is rotated relative to the other. The resiliency of the material forms a tight seal between the knife edge 14A and the glass cover 70.

Figure 9:
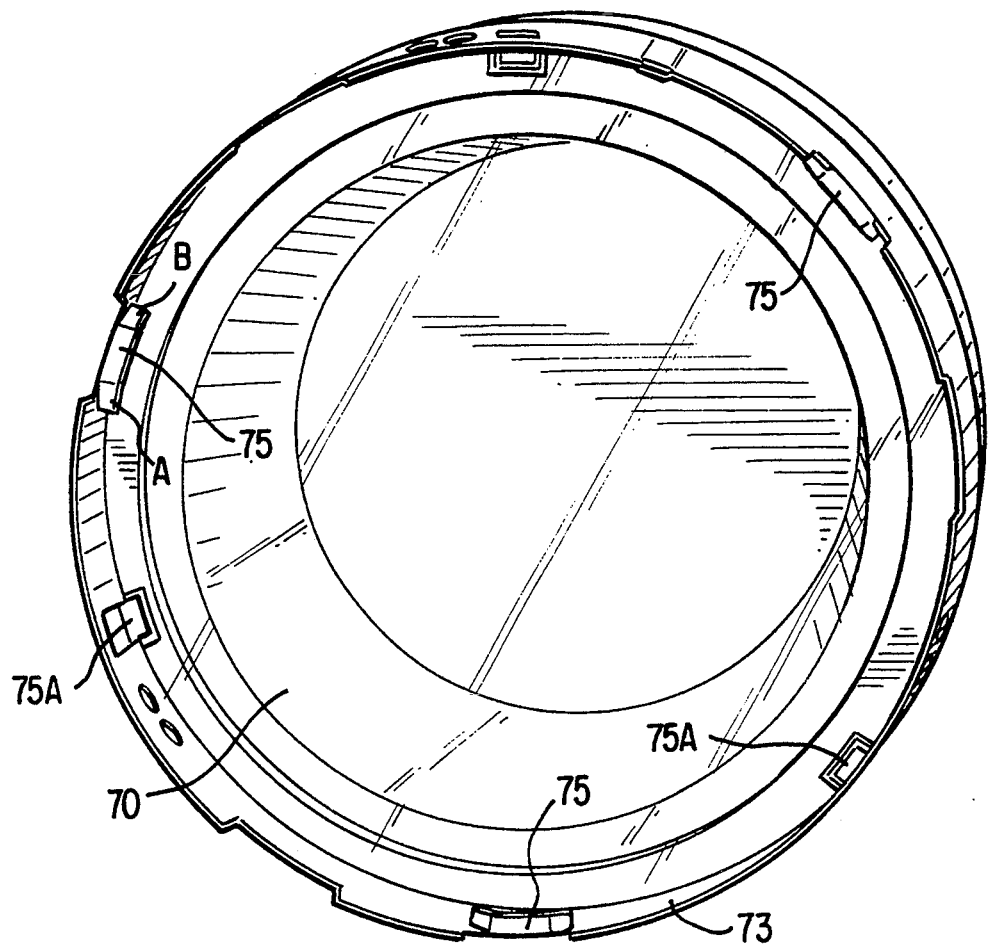
FIG. 9 is an oblique view of the glass cover with a metal ring attached thereto and provided in accordance with this invention.

The metal ring 73 is illustrated in FIG. 9 which, in accordance with an aspect of this invention, has a first plurality of tabs 75A struck out from the metal band 73 for engaging an outer face of the outwardly directed flange 71 of glass cover 70 and a second plurality of struck out tabs 75 for engaging the tapered ramps 76 of the bayonet mount. The tabs 75 and 75A are spaced relative to one another in the direction of the width of band 73. The metal band has an inwardly directed flange 78 for engaging a face of cover flange 71 to press it against glass cover 70.

From FIG. 9 it will be observed that the struck out tabs 75 have free outer end portions A and B bent inwardly to provide a spring-type engagement with the tapered ramp on the base.

The plastics for the molded housing, pilot bearings and meter base are engineering grade resins and preferably rigid thermoplastic materials such as those identified hereinbefore.

It is evident that those skilled in the art may new make numerous uses and modifications of and departures from the specific embodiment described herein without departing from the inventive concept. Consequently, the invention is to be construed as being limited solely by the spirit and scope of the appended claims.

What is claimed is:

1. An electric utility revenue meter having base integrally formed from a polycarbonate material, said meter base having a knife-edge seal projecting therefrom and formed integral therewith, said seal extending about the base adjacent the outer periphery to sealingly engage a flange of a cup shaped cover for an electro-mechanical induction meter.

2. A meter base in accordance with claim 1, wherein said base is glass fiber reinforced and ultraviolet light stabilized.

3. An electric utility revenue meter having base integrally formed from a polycarbonate material, said meter base having slots therein for receiving one of a plurality of current terminals and terminal locking means molded integral with said base and engageable with a formation on said current terminal associated therewith to lock said current terminals to said base.

4. A meter base in accordance with claim 3 wherein said terminal locking means comprises an arm molded integral with said meter base and overlapping a portion of the slot associated therewith, said current terminal having a terminal slot formed therein and wherein said arm projects into said terminal slot, locking said current terminal to said base.

5. A meter base in accordance with claim 3, wherein said base is glass fiber reinforced and ultraviolet light stabilized.

* * * * *